(12) United States Patent
Yoshida et al.

(10) Patent No.: US 7,022,182 B1
(45) Date of Patent: Apr. 4, 2006

(54) FERROMAGNETIC P-TYPE SINGLE-CRYSTAL ZINC OXIDE MATERIAL AND MANUFACTURING METHOD THEREOF

(75) Inventors: Hiroshi Yoshida, Kawanishi (JP); Kazunori Sato, Minoh (JP)

(73) Assignee: Japan Science and Technology Agency, Kawaguchi (JP)

( * ) Notice: Subject to any disclaimer, the term of this patent is extended or adjusted under 35 U.S.C. 154(b) by 0 days.

(21) Appl. No.: 10/049,615

(22) PCT Filed: Jul. 3, 2000

(86) PCT No.: PCT/JP00/04433

§ 371 (c)(1),
(2), (4) Date: Feb. 21, 2002

(87) PCT Pub. No.: WO01/16411

PCT Pub. Date: Mar. 8, 2001

(30) Foreign Application Priority Data

Sep. 1, 1999 (JP) .................................. 11-247959

(51) Int. Cl.
*C30B 23/00* (2006.01)

(52) U.S. Cl. ............................ 117/84; 117/88; 117/108; 117/956; 117/944

(58) Field of Classification Search ................ 117/84, 117/88, 108, 956, 944
See application file for complete search history.

(56) References Cited

U.S. PATENT DOCUMENTS

| | | | | |
|---|---|---|---|---|
| 4,174,421 A | * | 11/1979 | Nishiyama et al. | 428/432 |
| 5,368,764 A | * | 11/1994 | Yoon et al. | 252/62.59 |
| 5,393,444 A | * | 2/1995 | Asai et al. | 252/62.3 ZT |
| 5,679,965 A | * | 10/1997 | Schetzina | 257/103 |
| 6,291,085 B1 | * | 9/2001 | White et al. | 428/642 |
| 6,300,640 B1 | * | 10/2001 | Bhargava et al. | 250/483.1 |
| 6,342,313 B1 | | 1/2002 | White et al. | 428/701 |
| 6,410,162 B1 | | 6/2002 | White et al. | 428/642 |

(Continued)

FOREIGN PATENT DOCUMENTS

JP       07288259 A   * 10/1995

(Continued)

OTHER PUBLICATIONS

Yamamoto et al. "Solution using a codoping method to unipolarity for the Fabrication of p-type ZnO" jpn. J. Appl. Phys. vol. 38 (1999) pp 166-169.*

(Continued)

*Primary Examiner*—Robert Kunemund
*Assistant Examiner*—Matthew Song
(74) *Attorney, Agent, or Firm*—Westerman, Hattori, Daniels & Adrian, LLP

(57) ABSTRACT

The present invention provides a single-crystal ZnO thin film having a high ferromagnetic transition temperature. In one aspect of the present invention, the ZnO thin film comprises a ferromagnetic p-type single-crystal zinc oxide including a transition metal element consisting of Mn, and a p-type dopant. In another aspect of the present invention, the thin film comprises a ferromagnetic p-type single-crystal zinc oxide including a transition metal element consisting of Mn, a p-type dopant, and an n-type dopant. The single-crystal zinc oxide material can be applied to quantum computers and high-capacity magnetic-optical recording medium by combining with conventional n-type or p-type transparent electrode ZnO materials or optical fibers, and to powerful information-communication devices or quantum computers as a photoelectric material usable for a wide range from visible light to ultraviolet light.

4 Claims, 2 Drawing Sheets

U.S. PATENT DOCUMENTS

| | | | |
|---|---|---|---|
| 6,475,825 B1 | 11/2002 | White et al. | 438/104 |
| 6,498,362 B1 * | 12/2002 | Forbes et al. | 257/295 |
| 6,610,141 B1 | 8/2003 | White et al. | 117/4 |
| 2004/0094085 A1 | 5/2004 | White et al. | 117/4 |

FOREIGN PATENT DOCUMENTS

| | | |
|---|---|---|
| WO | WO 00/08691 | 2/2000 |

OTHER PUBLICATIONS

Patent abstracts of Japan. Abstract of JP 56-063900 (1981).*

Patent Abstracts of Japan. English Abstract of JP 07-288259 (1995).*

Fujimura et al. "Exotic Doping For ZnO Thin Films: Possibility of Monolithic Optical Integrated Circuit", 1999, Mat. Res. Soc. Symp. Proc. vol. 574, pp 317-322.*

Fujimura et al. Abstract of "Exotic Doping For ZnO Thin Films: Possibility of Monolithic Optical Integrated Circuit", Apr. 6-8, 1999, p. 1.*

Patent Abstract of Japan, Publication No. 5-254991, dated Oct. 5, 1993.

Patent Abstract of Japan, Publication No. 5-070286, dated Mar. 23, 1993.

Patent Abstract of Japan, Publication No. 6-279192, dated Oct. 4, 1994.

Patent Abstract of Japan, Publication No. 6-279193, dated Oct. 4, 1994.

T. Yamamoto et al.; Jpn. J. Appl. Phys., vol. 38, Part. 2, No. 2B, pp. L166-L-169, Feb. 15, 1999.

K. Minegishi et al.; Jpn. J. Appl. Phys., vol. 36, Part 2, No. 11A, pp. L1453-L1455, Nov. 1, 1997.

XP-002234024, INSPEC/IEE, Fujimura N. et al., "Exotic doping for ZnO thin films: possibility of monolithic optical integrated circuit", Multicomponent Oxide Films For Electronics. Symposium, San Francisco, CA, USA, Apr. 6-8, 1999.

* cited by examiner

FERROMAGNETIC P-TYPE SINGLE-CRYSTAL ZINC OXIDE MATERIAL AND MANUFACTURING METHOD THEREOF

TECHNICAL FIELD

The present invention relates to a Mn-doped ferromagnetic p-type single-crystal zinc oxide material and a manufacturing method thereof.

BACKGROUND ART

Zinc oxide is a material having electrically semiconductive, photoconductive and piezoelectric properties. There has been known a method for producing through a spattering or CVD process a zinc oxide material having suitable transparency and crystal-axis orientation for use as materials of piezoelectric or optoelectronics components (Japanese Patent Laid-Open Publication No. Hei 05-254991). A method has also been known for producing a transparent zinc oxide material having an electrically conductive or insulative property by doping zinc oxide of material with a doping material (Japanese Patent Laid-Open Publication No. Hei 05-070286). Further, a hydrothermal process has been known as a method for producing a piezoelectric semiconductor composed of a single crystal including zinc oxide as a primary component (Japanese Patent Laid-Open Publications No. Hei 06-279192, 06-279193, etc.). However, for such zinc oxide materials, it has not been reported to achieve a ferromagnetic state therein successfully.

DISCLOSURE OF INVENTION

Problems Solved by the Invention

Achieving a single-crystal ZnO thin film doped with Mn having a high ferromagnetic-transition temperature would enable providing optical isolators or high-density magnetic recording medium capable of transmitting larger amount of information, and would make it possible to fabricate a desirable electronic industry material required for oncoming large-scale information transmission. ZnO also has a large band gap of 3.3 eV. This opens the way to fabricate a light-transmittable ferromagnetic material, which may facilitate the extensive evolution of manufacturing technologies for optical devices, such as a photon computer utilizing a coherent spin state.

For achieving a ferromagnetic state with a high ferromagnetic-transition temperature by doping Mn into ZnO, it is required to heavily dope a hole (p-type carrier) having an interactional function for ferromagnetically uniform the spin in Mn doped into ZnO being a wide-gap semiconductor.

Means for Solving the Problems

In order to achieve the above object, the inventors have successfully developed a new method for controlling valence electron based on doping a p-type dopant by itself or codoping a p-type dopant and an n-type dopant, so as to ferromagnetically uniform the spin in Mn doped into ZnO, by utilizing an energy gain arising from itinerant kinetic-energy of the hole doped at a high concentration.

More specifically, according to one aspect of the present invention, there is provided a ferromagnetic p-type single-crystal zinc oxide (ZnO) material including Mn, which is a transition metal element acting as a leading part for generating ferromagnetism, and a p-type dopant (hole). In accordance with a principal that doping the p-type dopant into Mn-doped ZnO causes reduced kinetic energy along of the itinerant hole to provide a more stabilized ferromagnetic state than an antiferromagnetic intensive release of oxygen and increased defects. This causes degraded crystalizability and lowered doping effect. The substrate may include a silicon single-crystal substrate, a silicon single-crystal substrate formed with SiO, a sapphire single-crystal substrate. Preferably, the substrate has the same crystal structure as that of ZnO and substantially the same lattice constant as that of ZnO. There is no significant difference between the above substrates. Further, a chromium oxide layer or titanium oxide layer having an average value of respective lattice constants of the substrate and thin film may be interposed therebetween to reduce unconformity in crystal lattice.

In the method for manufacturing the aforementioned ferromagnetic p-type single-crystal ZnO material of the present invention, the concentration of the p-type dopant may be higher than that of the n-type dopant. This can be achieved, for example, by doping the n-type dopant with adjusting its implanted amount and the pressure of the atomic gas.

In the above manufacturing method, the ferromagnetic transition temperature of the zinc oxide material can be controlled by adjusting the Mn concentration and p-type dopant concentration (hole concentration) in the single-crystal zinc oxide material. The ferromagnetic critical temperature is increased as the Mn concentration and/or the doped-hole concentration are increased. Thus, the ferromagnetic transition temperature can be suitably controlled for any desired purpose according to the two adjustable parameters of the Mn and hole concentrations.

When the p-type dopant, n-type dopant or any oxide thereof, and/or Mn or any Mn oxide are doped, a radio beam, laser, X-ray or electron beam may be used to excite electronically to bring them into an atomic state.

The ferromagnetic p-type single-crystal ZnO material of the present invention has a ferromagnetic-transition critical temperature of 150 K or more. When Mn is doped into ZnO, Mn substitutes for sites of Zn having a radial size close to that of Mn with keeping a wurtzite structure, or $Zn^{2+}$ is substituted by $Mn^{2+}$. Thus, Mn goes into a high-spin state having an electron spin S of 5/2. The ferromagnetic interaction between respective spins can be controlled by adjusting the Mn concentration.

The ferromagnetic transition temperature is increased in connection with the increase of the Mn concentration and hole concentration. This allows the ferromagnetic transition temperature to be changed flexibly from higher temperature to lower temperature according to need by adjusting the Mn concentration and the doped-hole concentration.

According to still another aspect of the present invention, there is provided a method for manufacturing the aforementioned ferromagnetic p-type single-crystal ZnO material, in which when an atomic gas from a solid-state source of Zn or Zn oxide and an activated oxygen are supplied onto a semiconductor substrate to grow a single-crystal zinc-oxide thin film on the substrate, in a thin film forming process such as the MOCVD process or MBE process, an atomic p-type dopant and an atomic Mn are supplied all together onto the substrate and deposited under a low temperature thereon.

The solid-state source of Zn or Zn oxide may include a pure zinc powder and a ZnO sintered material.

Preferably, the substrate has a temperature in the range of 300° C. to 800° C. The temperature less than 300° C. causes significantly lowered growth rate of the thin film, resulting in degraded practicability. The temperature higher than 800°

C. leads to or paramagnetic state, the p-type single-crystal zinc oxide material can be provided with a stable ferromagnetic critical temperature.

Further, according to another aspect of the present invention, there is provided a p-type ferromagnetic single-crystal ZnO material including Mn, which is a transition metal element acting as a leading part for generating ferromagnetism, and a p-type dopant (hole), wherein an n-type dopant is further included together with the p-type dopant. This facilitates achieving of the p-type single-crystal ZnO capable of providing significantly increased itinerant hole to enhance a ferromagnetic interaction between Mn ions.

The p-type dopant may be one or more components selected from a group consisting of C, N, and any suitable oxide thereof (e.g. $CO_2$, CO, $N_2O$, NO, or $NO_3$). The n-type dopant may be one or more components selected from a group consisting of B, Al, In, Ga, Zn, H, and any suitable oxide thereof (e.g. $B_2O_3$, $Al_2O_3$, $In_2O_3$, $Ga_2O_3$, or ZnO).

An entire ratio of Mn is incorporated into ZnO as a solid solution. Thus, the concentration of Mn included in the ferromagnetic p-type single-crystal ZnO material of the present invention can be set in the range of 1 to 99 mol %.

The ferromagnetic p-type single-crystal ZnO material of the present invention comprises a single crystal ZnO having a hole concentration of $1 \times 10^{18}$ $cm^{-3}$ or more, and a low resistance (1 Ω·cm or less). Increasing the hole concentration makes the doped-hole itinerant around Mn ions, and thereby the kinetic energy of the hole is reduced. This provides further stabilized ferromagnetic state and induces an enhanced ferromagnetic interaction between Mn ions.

BEST MODE FOR CARRYING OUT THE INVENTION

A method for forming a ferromagnetic p-type single-crystal ZnO thin film on a substrate through the MBE process will now be described based on an embodiment of the present invention.

Embodiment 1

Figure 1:
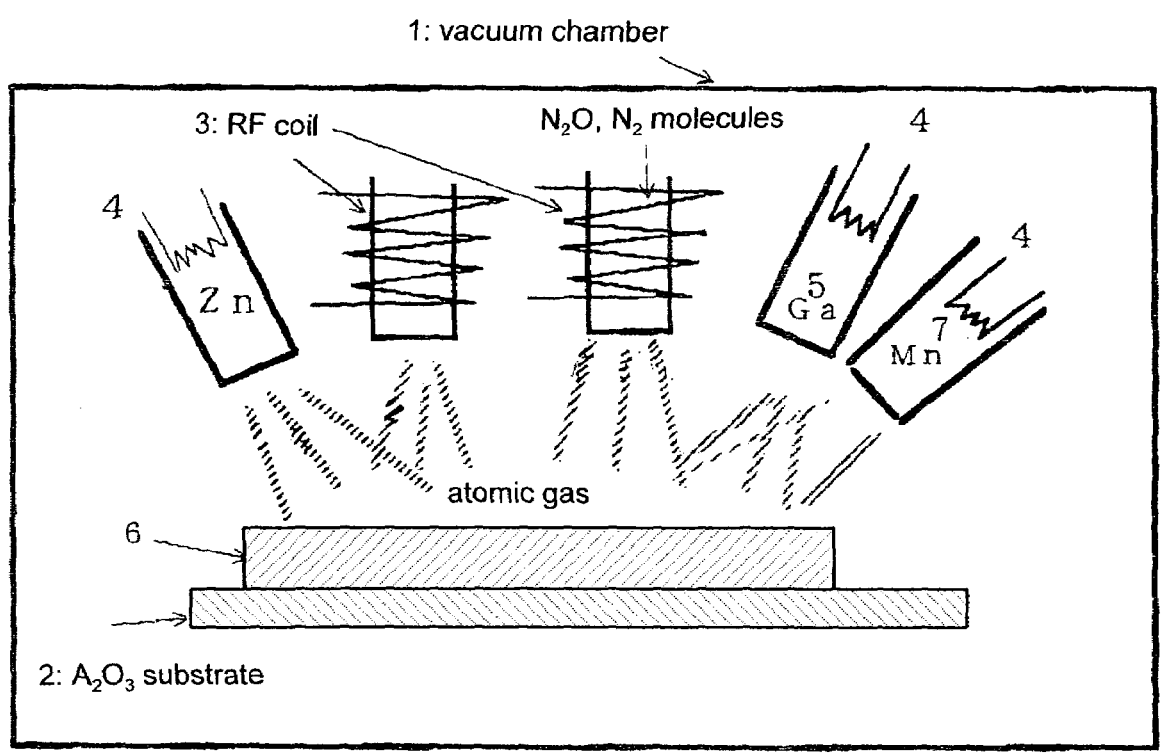
FIG. 1 is a schematic side view showing an apparatus for manufacturing a Mn-doped ferromagnetic p-type single-crystal ZnO material through the MBE process.

As shown in FIG. 1, an $Al_2O_3$ substrate 2 was placed within a vacuum chamber 1 maintained in a constant vacuum of $10^{-8}$ Torr. Then, both atomic gases of Zn and O (oxygen) were supplied onto the substrate 2 to fabricate a ZnO thin film on the substrate 2. Zn and Mn to be used were prepared by heating each corresponding solid-state source having a purity of 99.99999 with a heater to bring them into an atomic state. For O and N to be used, the corresponding atomic gases having a purity of 99.99999 were prepared by activating $O_2$ and $N_2O$ (or $N_2$) using an RF radical cell, respectively. N serving as the p-type acceptor was a nitrogen radical generated by a RF (13.56 MHz) excitation type radical beam source. Ga and Mn to be used were prepared by radiating the microwave level of electromagnetic waves to each corresponding molecular gas or by bringing each corresponding elemental cell into an atomic state under a high temperature.

ZnO is transparent because of its large band gap of 3.3 eV, and the life of its exciton is longer than that of GaN or the like. Thus, ZnO comes under the spotlight as a material of ultraviolet/blue lasers or ultraviolet/blue light emitting elements. However, in comparison with a low-resistance n-type ZnO material, it has been difficult to fabricate a p-type ZnO due to its unipolarity.

In the present invention, the n-type dopant such as Ga, Al, or In and the p-type dopant such as N are codoped, for example, by a ratio of 1:2. This allows ZnO to be doped at a high concentration to the extent of $10^{19}$ $cm^{-3}$ to $10^{21}$ $cm^{-3}$, whereas in case of doping N by itself, ZnO is doped only to about $10^{18}$ $cm^{-3}$. With the resulting kinetic energy of the itinerary hole, the ferromagnetic state of Mn can be changed into a ground state to achieve further stabilized ferromagnetic state.

The electron spin S in Mn doped into ZnO is 5/2, and the exchange split (up to 3 eV) of $Mn^{2+}$ (d5) is lager than the crystal field split (up to 0.8 eV) thereof, which shows that a desirable high-spin state is achieved. Doping a hole into such a system in a ferromagnetic state makes the doped-hole itinerant around Mn ions in a crystal without inverting any spin. Thus, the kinetic energy of the hole is reduced, and thereby the ferromagnetic state is more stabilized than an antiferromagnetic state.

In the antiferromagnetic state, it is required to inverse the spin in order to make the doped-hole itinerant in the crystal. In addition to lots of energy for inverting the spin, a significant energy is required for the exchange interaction. Thus, generating the ferromagnetic state based on the doped-Mn with the itinerant doped-hole can provide an efficient electron-theoretical mechanism for stabilizing the ferromagnetic state more than the antiferromagnetic or paramagnetic state. As components for used in this processing, FIG. 1 shows an RF (radio frequencies) coil 3, a heater 4, an elemental cell (Ga source) 5, and an elemental cell (Mn source) 7.

During forming a film, while Ga as the n-type dopant, atomic N as the p-type dopant and atomic Mn were supplied all together along the surface of the substrate 2 at partial pressures of $10^{-7}$ Torr, $5 \times 10^{7}$ Torr and $10^{-7}$ Torr, respectively, desired crystal growth was induced at each temperature of 350° C., 400° C., 450° C., 600° C., and 750° C. to form Mn-doped ferromagnetic p-type single-crystal ZnO thin films 6.

Table 1 shows hole concentration measurements, Mn concentration measurements through the SIMS, and ferromagnetic transition temperature measurements through the SQUID and the measurement of magnetic coefficient, for each of the ferromagnetic p-type single-crystal ZnO thin film obtained at the above respective crystal growth temperatures.

TABLE 1

| substrate temperature (° C.) | acceptor concentration ($cm^{-3}$) codoping of Ga and N | Mn concentration (mol %) | ferromagnetic transition temperature (K.) |
|---|---|---|---|
| 350 | $4 \times 10^{18}$ | 5.2 | 150 |
| 400 | $5 \times 10^{18}$ | 8.0 | 289 |
| 450 | $6 \times 10^{19}$ | 12.4 | 389 |
| 600 | $8 \times 10^{20}$ | 25.3 | 520 |
| 750 | $8 \times 10^{21}$ | 34.5 | 780 |

As can be seen from the dependence of the ferromagnetic transition temperature on the Mn concentration, the acceptor concentration, and the substrate temperature, higher concentrations of Mn and p-type carrier (hole) provides higher ferromagnetic transition temperature (°K). Further, it can be seen that the ferromagnetic interaction between Mn ions tends to increase depending on the hole concentration, and the ferromagnetic interaction between Mn spins tends to increase in response to the increase of the Mn concentration.

Figure 2:
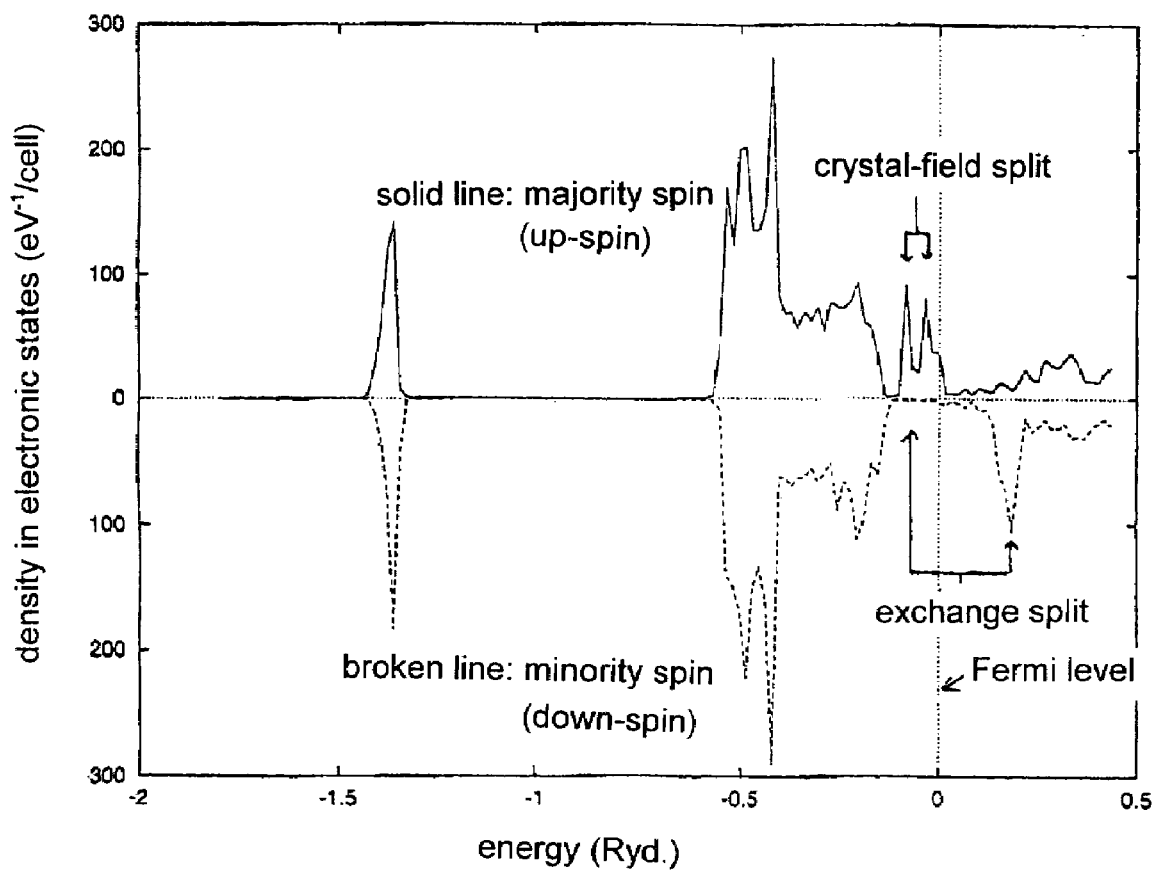
FIG. 2 is a graph showing the density in electronic states of a ferromagnetic p-type ZnO material codoped with Mn as a transition metal element, Ga as a donor element, and N as an acceptor element.

FIG. 2 shows the density in electronic states of a ferromagnetic p-type single-crystal ZnO material doped with Mn at a high concentration. The exchange split between the majority spin and the minority spin is about 3 eV, and the crystal-field split is about 0.8 eV, which shows that a high-spin state (S=5/2) has been achieved. The local magnetic moment at Mn sites is 4.8 Bohr magneton ($\mu_B$) per Mn atom.

INDUSTRIAL APPLICABILITY

As described above, the present invention provides a novel ferromagnetic p-type single-crystal ZnO (zinc oxide) material including Mn and a p-type dopant (hole). This material can be applied to quantum computers and high-capacity magnetic-optical recording medium by combining with conventional n-type or p-type transparent electrode ZnO materials or optical fibers, and to powerful information-communication devices or quantum computers as an optoelectronic material usable for a wide range from visible light to ultraviolet light.

What is claimed is:

1. A ferromagnetic p-type single-crystal manganese-doped zinc oxide material having a ferro magnetic-transition critical temperature of 150 K or mores comprising a single-crystal of zinc-manganese oxide that contains 5.2 to 99 mol % manganese, and a p-type dopant selected from a group consisting of C, N, and oxides thereof, wherein said p-type single-crystal zinc-manganese oxide material having a hole concentration of $1 \times 10^{18}$ cm$^{-3}$ or more and a low resistance of 1 Ω·cm or less.

2. A ferromagnetic p-type single-crystal zinc-manganese oxide material having a ferro magnetic-transition critical temperature of 150 K or more, comprising a single-crystal of zinc-manganese oxide that contains 5.2 to 99 mol % manganese, a p-type dopant selected from a group consisting of C, N, and oxides thereof, and an n-type dopant selected from a group consisting of B, Al, In, Ga, Zn, and oxides thereof, wherein said p-type single-crystal zinc-manganese oxide material having a hole concentration of $1 \times 10^{18}$ cm$^{-3}$ or more and a low resistance of 1 Ω·cm or less.

3. A method for manufacturing a ferromagnetic p-type single-crystal zinc-manganese oxide material having a ferro magnetic-transition critical temperature of 150°K or more, comprising steps of:

holding a semiconductor substrate within a temperature range of 300–800° C. in a vacuum atmosphere, and supplying an atomic gas from a solid-state source of Zn or Zn oxide and an activated oxygen onto said semiconductor substrate to grow a single-crystal zinc-manganese oxide thin film on the substrate while an atomic p-type dopant selected from a group consisting of C, N, and oxides thereof and an atomic Mn are supplied all together onto the substrate.

4. A method as defined in claim 3, further comprising a step of doping an n-type dopant so as to provide a higher concentration of the p-type dopant than that of the n-type dopant.

* * * * *